DUAL FREQUENCY INTERMEDIATE-FREQUENCY COUPLING CIRCUIT
Filed Sept. 25, 1967
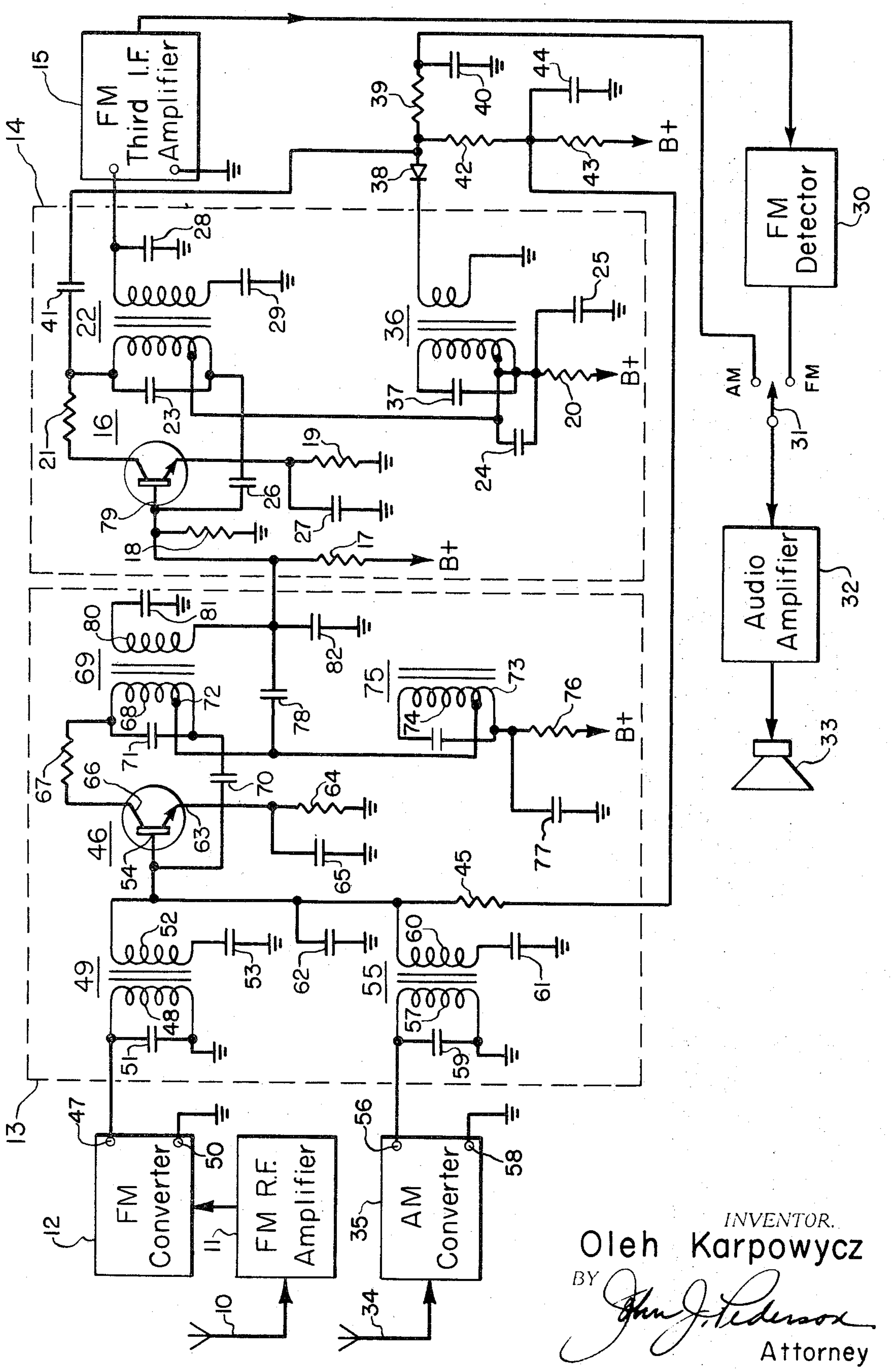
INVENTOR.
Oleh Karpowycz
BY John J. Pederson
Attorney United States Patent Office 3,528,013

Patented Sept. 8, 1970

3,528,013
DUAL FREQUENCY INTERMEDIATE-FREQUENCY COUPLING CIRCUIT

Oleh Karpowycz, Addison, Ill., assignor to Zenith Radio Corporation, Chicago, Ill., a corporation of Delaware Filed Sept. 25, 1967, Ser. No. 670,184
Int. Cl. H04b 1/16
U.S. Cl. 325—317 3 Claims

ABSTRACT OF THE DISCLOSURE

A multi-band AM/FM wave-signal receiver includes an economical intermediate-frequency coupling circuit which requires fewer components than previous designs. In particular, two tuned interstage transformers, each operable at a different frequency, serve in conjunction with three capacitors to couple signals in two widely divergent frequency bands from one intermediate-frequency amplifier stage to another. By arranging for one of the capacitors to concurrently serve as a tuning, by-pass and coupling capacitor a savings of at least one passive component is realized.

BACKGROUND OF THE INVENTION

This invention relates in general to multi-band wave-signal receivers, and more particularly to an improved intermediate-freqeuency coupling network for use therein. The invention is especially but not exclusively applicable to the intermediate-frequency amplifier system of a superheterodyne radio receiver capable of selectively receiving either amplitude-modulated (AM) carrier waves lying in the AM broadcast band or frequency-modulated (FM) carrier waves of the FM broadcast band.

Under established U.S. standards governing radio broadcasts there exist two broadcast bands, an AM low-frequency band extending from 550 kHz. to 1600 kHz. and an FM high-frequency band extending from 88 mHz. to 108 mHz. In designing consumer-type radio receivers capable of receiving signals in these widely divergent frequency bands, it has beecome almost universal practice to utilize different intermediate-frequencies for the two operating modes, a low-frequency in the order of 50 kHz. for AM reception and a higher frequency in the order of 10 mHz. for FM reception. This is necessary because of certain practical design considerations, namely image response and selectivity, which preclude the use of a common IF frequency.

Obviously, for reasons of economy and to avoid unnecessary duplication of circuitry, it is desirable that the same intermediate-frequency (IF) amplifier devices serve in both modes, and preferably with a minimum of switching to avoid the electrical noise and connection problems generally associated with switch contacts. Thus, it has become almost universal practice to employ IF amplifiers having coupling circuits adapted to operate in the two IF bands without switching, the circuits being arranged so as to have minimum interaction with each other.

Coupling networks for AM/FM amplifiers have therefore generally taken the form of two independent tuned circuits, parallel-connected to the common amplifier devices. Such circuits, while providing generally satisfactory performance and enabling the use of a common amplifier device, have in themselves been somewhat complicated and expensive. As a result, a need for simplification and improvement of these interstage coupling circuits has existed to reduce the component cost of consumer AM/FM receivers.

Accordingly, it is a general object of the invention to provide a new and improved interstage coupling network for use in a multi-band wave-signal receiver.

It is a more specific object of the invention to provide an interstage coupling network which requires fewer components than its prior art counterparts.

It is a still more specific object of the invention to provide an economical interstage coupling network for an AM/FM receiver which obviates the need for at least one coupling capacitor.

In accordance with the invention, a new and improved intermediate-frequency interstage coupling circuit is provided for an AM/FM wave-signal receiver of the type having first and second intermediate-frequency amplifier devices, each with input and output terminals and each operable at first and second different predetermined frequencies. The inventive circuit includes means comprising a first interstage coupling transformer for translating signals of the first predetermined frequency, the coupling transformer having a primary winding tuned to the first predetermined frequency and further having a secondary winding with first and second terminals. Means are provided for coupling the primary winding to the output terminal of the first intermediate-frequency amplifier to apply the signal of the first predetermined frequency to the primary winding. A first capacitor is connected between the first terminal of the secondary winding and a plane of reference potential. Means comprising a second interstage coupling transformer are provided for translating signals of the second predetermined frequency, the second coupling transformer having a single winding tuned to the second predetermined frequency. Further included are means for applying the signals of the second predetermined frequency to the single winding of the second interstage coupling transformer. Means comprising a second capacitor are included for coupling the signals of the second predetermined frequency from the single winding to the second terminal of the secondary winding. Means comprising a third capacitor connected between the second terminal and the plane of reference potential are provided for cooperating with the first and second capacitors to resonate the secondary winding at the first predetermined frequency, to provide a voltage divider for coupling a portion of the signals of the second predetermined frequency to the second terminal, and to provide a partial by-pass to the signals of the first predetermined frequency. Finally, means are included for coupling the signals of the first and second predetermined frequencies from the second terminal of the secondary winding to the input terminal of the second intermediate-frequency amplifier.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawing, in which the single figure is a schematic representation, partially in block form, of a wave-signal receiver embodying the present invention.

DESCRIPTION OF THE PREFERRED EMBODIMENT

With the exception of certain detailed circuitry in the first IF amplifier stage, the illustrated receiver is essentially conventional in design and therefore only a brief description of its structure and operation need be given here. In accordance with standard practice, a common intermediate-frequency channel is utilized for signal processing in both AM and FM operating modes.

Considering FM-mode operation first, a received FM signal is intercepted by an antenna 10 and coupled in a conventional manner to a radio-frequency (RF) amplifier 11, which may contain one or more frequency-selective stages. The output of RF amplifier 11 is applied to an FM converter stage 12, wherein it is translated to a predetermined intermediate-frequency for subsequent amplification by first, second and third IF amplifier stages, 13, 14 and 15, respectively. Although IF amplifier stage 13 incorporates certain novel input and output coupling circuitry which will be discussed in detail later, it otherwise operates as a conventional IF amplifier stage and the amplified intermediate-frequency output signal therefrom is applied to second IF amplifier stage 14 for further amplification.

IF amplifier stage 14 incorporates a transistor amplifier device 16 connected in a conventional common-emitter configuration with bias resistors 17, 18, and 19 and collector decoupling resistor 20. The signal from stage 13 is applied to the base of transistor 16, and after amplification in that device is impressed through isolation and amplitude-limiting resistor 21 across the primary winding of an interstage coupling transformer 22, which is tuned to resonance by a shunt-connected capacitor 23. A tap on that winding is by-passed to ground at FM IF signal frequencies by series-connected capacitors 24 and 25 to provide a predetermined amount of signal loss in the output circuit of transistor 16, without which that stage would be unstable. A capacitor 26 is connected between the primary winding of transformer 22 and the base of transistor 16 to provide neutralization for that device, and the emitter of transistor 16 is by-passed to ground at signal frequencies by a capacitor 27. The secondary winding of transformer 22 is tuned to the FM IF frequency by a pair of $\pi$-connected capacitors 28 and 29, which serve to couple the IF output signal from stage 14 to the third IF amplifier stage 15.

IF amplifier 15 further amplifies and limits the FM IF signal before applying it to an FM detector stage 30, which may comprise any one of a number of FM detector circuits including the well-known ratio-detector circuit. The audio-frequency output signal from detector 30 is applied to one terminal of a mode switch 31, which selects an appropriate detector output signal for application to audio amplifier 32 depending on the operating mode of the receiver. Amplifier 32 amplifies the applied audio signal to a level sufficient for driving a loudspeaker 33.

During AM operation an intercepted signal is coupled by conventional means from antenna 34 to an AM converter 35, wherein it is converted to an intermediate-frequency, preferably much lower than that of the IF output signal from FM converter 12. The AM IF signal from converter 35 is amplified by first IF amplifier 13 and applied to second IF amplifier 14 in much the same manner as the FM IF signal. During AM reception FM interstage transformer 22 is not resonant at the operating frequency of IF amplifier 14 and therefore presents only a negligible load impedance to transistor 16. The effective collector load now comprises another tuned transformer 36, the primary winding of which is resonated by a capacitor 37 at the AM IF operating frequency. This winding, like the primary winding of FM interstage transformer 22, is tapped to introduce a predetermined amount of signal loss to stage 14 to assure stable operation. An untuned secondary winding on transformer 36 applies the amplified AM IF output signal to a detector diode 38, which derives audio-frequency information from the AM IF signal for application to the remaining terminal of switch 31. A resistor 39 and a capacitor 40 cooperate with diode 38 in the detection process by serving to filter the derived audio signal.

Detector 38 performs an ancillary function of developing an AGC bias for controlling the gain of IF amplifier stage 13 to compensate for variations in the level of intercepted sigals. The exact manner in which this is accomplished is described and claimed in U.S. Letters Pat. No. 3,287,644 to Dwight J. Poppy, assigned to the present assignee.

During FM mode operation a portion of the FM IF output signal from transistor 16 is coupled by a capacitor 41 to diode 38, which develops a negative bias depending on the relative amplitude of the FM IF signal. Similarly, diode 38 develops a negative bias during AM mode operation according to the relative amplitude of the AM IF signal. The bias thus developed is applied to one end of the voltage divider formed by resistors 42 and 43, the other end of which connects to source B+. The juncture of these resistors is by-passed to ground at AM and FM IF signal frequencies by a filter capacitor 44 and is connected by an isolation resistor 45 to the base of the amplifier transistor 46 of first IF amplifier stage 13. As the amplitude of the IF signal increases, the control bias applied to transistor 46 becomes less positive, thereby causing the gain of that device to decrease so as to maintain a relatively constant IF output level.

Having considered briefly the structure and operation of the receiver as a whole, we can now look to the detailed circuitry of IF amplifier stage 13. One output terminal 47 of FM converter 12 is coupled to one end terminal of the primary winding 48 of an FM interstage transformer 49 and the remaining end terminal of winding 48 and the other output terminal 50 of converter 12 are grounded. Winding 48 is shunted by a tuning capacitor 51. The secondary winding 52 of transformer 49 has one end terminal connected to ground by a tuning capacitor 53 and its other end terminal connected to the base 54 of transistor 46.

The output of AM converter 35 is applied to base electrode 54 by an interstage coupling transformer 55. One output terminal 56 of converter 35 is connected to one end terminal of the primary winding 57 of transformer 55 and the remaining end terminal of winding 57 and the remaining output terminal 58 of converter 35 are grounded. Primary winding 57 is tuned to resonance at the AM IF frequency by a shunt-connected capacitor 59, and the secondary winding 60 of transformer 55 has one end terminal connected to ground by a tuning capacitor 61 and its other end terminal connected to base 54. A capacitor 62 connected from base 54 to ground performs several functions as a common matching and tuning element in conjunction with the secondary windings 52 and 60 of transformers 49 and 55, respectively. The features of this input circuit to IF amplifier stage 13 are claimed in the copending application of Oleh Karpowycz and Barry Kipnis, Ser. No. 670,201, assigned to the present assignee and filed concurrently herewith.

The emitter 63 of transistor 46 is connected to ground by the parallel combination of an emitter bias resistor 64 and a by-pass capacitor 65 and the collector 66 is connected through an isolation and amplitude-limiting resistor 67 to one end terminal of the primary winding 68 of an FM interstage coupling transformer 69. The other end terminal of winding 68 is connected by a neutralizing capacitor 70 to base 54 and the entire winding is shunted by a capacitor 71. Winding 68 has a tap 72 which is connected to a tap 73 on the single winding 74 of an AM interstage coupling transformer 75. One end terminal of winding 74 is connected to source B+ by a collector decoupling resistor 76 and is by-passed to ground at signal frequencies by a capacitor 77. Tap 73 is further connected by a capacitor 78 to the base 79 of amplifier transistor 16.

The secondary winding 80 of transformer 69 has one end terminal connected to ground by a capacitor 81 and its other end terminal connected directly to base 79 and thence to ground by a capacitor 82. This capacitor, like capacitor 62 in the input circuit, serves as a common element in both the AM and FM output circuits to achieve a reduction of at least one passive component over prior art circuits. The manner in which this is done will be explained shortly.

In operation, the intermediate-frequency output signal from FM converter 12 is applied to the primary winding 48 of interstage transformer 49. The secondary winding 52 of this transformer is tuned to the FM IF frequency, which in practice is approximately 10.7 mHz., by capacitors 53 and 62. Capacitor 53 and capacitor 62 are connected in a $\pi$/network configuration relative to winding 52. It will be appreciated that the two capacitors comprise a voltage divider network to the FM IF signal included in winding 52, and that by adjusting their relative capacitances, and hence their impedances at the FM IF frequency, a preselected amount of signal loss can be introduced into the input circuit of transistor 46. For present-day IF amplifier transistors, which have a gain of approximately 50 db, a total signal loss in each IF stage of approximately 20 is necessary to maintain stability and to allow for normally expected variations in component values during production. Practical design considerations, however, limit the minimum capacity of the capacitors so that it is neither practical nor desirable to obtain the full 20 db signal loss in the input stage. Thus, it is desirable to obtain part of the total required signal loss in the output circuit of the transistor, and to that end the present embodiment employs tapped AM and FM output circuits in both its first and second IF amplifier stages.

The AM IF signal from converter 35 is applied to the primary winding 57 of transformer 55, which is tuned to the AM IF frequency of approximately 455 kHz. Like winding 52, the secondary winding 60 of transformer 55 is $\pi$/network tuned which permits a predetermined amount of loss to be obtained for the AM IF signal. In this case capacitor 61 and the parallel combination of capacitors 53 and 62 form the two legs of the $\pi$/network, and the same considerations apply for the selection of the capacitors as applied to the FM input circuit. Of course, it is necessary that the net capacity of the capacitors across windings 52 and 60 be such that resonance can be achieved in the two windings with reasonable "Q" factors for the particular transformer designs being used.

The AM and FM signals applied to base 54 are amplified by transistor 46 and applied to respective ones of interstage transformers 69 and 75. Transistor 46 is connected in a common emitter configuration and biased in a conventional manner by resistor 64 and collector decoupling resistor 76. Capacitor 65 by-passes the emitter to ground at signal frequencies and capacitor 70 provides a sufficient amount of neutralization to prevent oscillation of transistor 46. The primary 68 of interstage transformer 69 is resonant at the FM intermediate frequency and has a tap 72 which introduces a predetermined amount of stabilizing signal loss. The AM interstage transformer 75, on the other hand, is not resonant at the FM IF frequency and acts as a choke to allow only unidirectional B+ current to be applied to collector 66 through resistors 67 and 76.

Secondary winding 80 of transformer 69 is $\pi$/network tuned by capacitor 81 and capacitor 82. These capacitors serve not only to tune winding 80, but also to introduce a predetermined amount of stabilizing signal loss to the input circuit of second IF amplifier 14.

During AM reception transformer 69 is not resonant at the IF operating frequency and the AM IF signal appears across winding 74, which is tuned to resonance at 455 kHz. by capacitor 83 and is tapped at tap 73 to introduce a predetermined amount of signal loss in the AM output circuit of IF amplifier stage 13. Capacitor 78 and the parallel combination of capacitors 82 and 81 form a voltage divider which couples a predetermined portion of the amplified AM IF signal from transformer 75 to the base of transistor 16.

In accordance with the invention, the output circuit of IF amplifier stage 13 utilizes novel coupling circuitry which allows certain components in that circuit to perform multiple functions, thereby achieving a savings of at least one passive component. In particular, capacitor 82 serves: (1) in conjunction with capacitor 81 to provide the necessary tuning capacitance for secondary winding 80, (2) as part of a voltage-divider network for coupling a portion of the amplified AM IF signal from transformer 75 to transistor 16, and (3) in conjunction with capacitor 78 as a partial by-pass to ground at FM IF frequencies for tap 72 on the primary winding 68 of transformer 69.

Two novel coupling circuits have been described which permit simplification of the intermediate-frequency amplifier stages of an AM/FM radio receiver without sacrificing performance. In particular, use of both described circuits results in the elimination of at least two capacitors over prior-art designs. It will be appreciated that this, coupled with the attendant cost of labor and the present-day high volume production of consumer radio receivers, results in a cost reduction of great significance.

The following are a set of component values for the coupling circuit of the invention which have been found to provide satisfactory operation. It will be appreciated that these values are given by way of example, and that other values may be substituted without departing from the principles of the invention.

C65—0.1 mfd.
C71—36 mmfd.
C70—2.7 mmfd.
C78—560 mmfd.
C81—60 mmfd.
C82—680 mmfd.
C77—.01 mfd.
R64—680 ohms.
R67—270 ohms.
R76—470 ohms.
R17—10,000 ohms.
R18—3300 ohms.
TR 46—Fairchild SE 5006
TR 16—Fairchild SE 5025
T 69—Primary: 34 turns No. 36 tapped at 27 turns, 9/32 in. form; secondary: 29 turns No. 36, 9/32 in. form
T 75—145 turns No. 41 litz wire tapped at 122 turns, 3/32 in. bobbin form (663 $\mu$h. at 1 kHz.)

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. In an AM/FM wave-signal receiver of the type having first and second intermediate-frequency amplifier devices, each having input and output terminals and each operable at first and second different predetermined frequencies, an intermediate-frequency interstage coupling circuit comprising:

means comprising a first interstage coupling transformer, for translating FM signals of said first predetermined frequency, said coupling transformer having a primary winding tuned to said first predetermined frequency and further having a secondary winding with first and second terminals;

means for coupling said primary winding to said output terminal of said first intermediate-frequency amplifier to apply said FM signals of said first predetermined frequency to said primary winding;

a first capacitor connected between said first terminal of said secondary winding and a plane of reference potential;

means, comprising a second interstage coupling transformer, for translating AM signals of said second predetermined frequency, said second coupling transformer having a single winding and an associated capacitance and being tuned to said second predetermined frequency;

means for applying said AM signals of said second predetermined frequency to said single winding of said second interstage coupling transformer;

means comprising a second capacitor for coupling said AM signals of said second predetermined frequency from said single winding to said second terminal of said secondary winding;

means comprising a third capacitor connected between said second terminal and said plane of reference potential for cooperating with said first and second capacitors to resonate said secondary winding at said first predetermined frequency, to provide a voltage-divider for coupling a portion of said AM signals of said second predetermined frequency to said second terminal, and to provide a partial bypass to said FM signals of said first predetermined frequency; and means for coupling said signals of said first and second predetermined frequencies from said second terminal of said secondary winding to said input terminal of said second intermediate-frequency amplifier.

2. A wave-signal receiver as described in claim 1, wherein said first, second, and third capacitors are in the order of 60 micro-microfarads, 680-micro-microfarads, and 560 micro-microfarads, respectively.

3. A wave-signal receiver as described in claim 1, wherein said primary winding of said first transformer and said single winding of said second transformer are provided with respective intermediate taps, and in which said intermediate taps are directly connected together and to said second capacitor.

References Cited

UNITED STATES PATENTS

| | | | |
|---|---|---|---|
| 2,614,212 | 10/1952 | Loughlin | 325—489 |
| 3,172,040 | 3/1965 | Schultz | 325—317 X |
| 3,206,680 | 9/1965 | Mason | 325—315 |
| 3,287,644 | 11/1966 | Poppy | 325—316 |

ROBERT L. GRIFFIN, Primary Examiner

B. V. SAFOUREK, Assistant Examiner

U.S. Cl. X.R.

325—488